United States Patent
Tsukada et al.

(10) Patent No.: US 12,369,259 B2
(45) Date of Patent: *Jul. 22, 2025

(54) CIRCUIT FORMING METHOD (71) Applicant: FUJI CORPORATION, Chiryu (JP)

(72) Inventors: Kenji Tsukada, Toyota (JP); Ryojiro Tominaga, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 20 days.

This patent is subject to a terminal disclaimer.

(21) Appl. No.: 18/251,445

(22) PCT Filed: Nov. 10, 2020

(86) PCT No.: PCT/JP2020/041856
§ 371 (c)(1),
(2) Date: May 2, 2023

(87) PCT Pub. No.: WO2022/101965
PCT Pub. Date: May 19, 2022

(65) Prior Publication Data
US 2024/0023249 A1    Jan. 18, 2024

(51) Int. Cl.
| H05K 3/32 | (2006.01) |
| H05K 1/11 | (2006.01) |
| H05K 3/00 | (2006.01) |
| H05K 3/12 | (2006.01) |
| H05K 3/28 | (2006.01) |
| H05K 1/18 | (2006.01) |

(52) U.S. Cl.
CPC .......... *H05K 3/321* (2013.01); *H05K 1/111* (2013.01); *H05K 3/0014* (2013.01); *H05K 3/125* (2013.01); *H05K 3/1283* (2013.01); *H05K 3/284* (2013.01); *H05K 1/181* (2013.01)

(58) Field of Classification Search
CPC ...... H05K 3/321; H05K 1/111; H05K 3/0014; H05K 3/125; H05K 3/1283; H05K 3/284; H05K 1/181
See application file for complete search history.

(56) References Cited

U.S. PATENT DOCUMENTS

| 11,570,900 | B2 * | 1/2023 | Tsukada | H05K 1/097 |
| 11,849,545 | B2 * | 12/2023 | Tsukada | H05K 3/28 |
| 2007/0128855 | A1 * | 6/2007 | Cho | B33Y 80/00 438/637 |
| 2015/0382445 | A1 | 12/2015 | Choi | |
| 2016/0288213 | A1 * | 10/2016 | Kumaki | H01L 29/4908 |
| 2018/0035536 | A1 | 2/2018 | Matsumura et al. | |
| 2020/0346452 | A1 * | 11/2020 | Tominaga | H05K 3/46 |

FOREIGN PATENT DOCUMENTS

| JP | 2017-130553 A | | 7/2017 | |
| JP | 2018-18898 A | | 2/2018 | |
| JP | 2018018898 A | * | 2/2018 | ........... H05K 1/0271 |
| JP | 2019-178059 A | | 10/2019 | |
| WO | WO-2019102522 A1 | * | 5/2019 | ............. B22F 10/10 |

* cited by examiner

Primary Examiner — Alexander M Weddle
(74) Attorney, Agent, or Firm — Oblon, McClelland, Maier & Neustadt, L.L.P.

(57) ABSTRACT

A circuit forming method including a first wiring forming step of forming a first metal wiring on a resin layer, and a second wiring forming step of forming a second metal wiring on the first metal wiring, in which a Young's modulus of the first metal wiring and a Young's modulus of the second metal wiring are different from each other.

6 Claims, 7 Drawing Sheets

CIRCUIT FORMING METHOD

TECHNICAL FIELD

The present disclosure relates to a circuit forming method of forming a metal wiring on a resin layer.

BACKGROUND ART

The following Patent Literature describes a circuit forming method of forming a metal wiring on a resin layer.

PATENT LITERATURE

Patent Literature 1: JP-A-2017-130553

BRIEF SUMMARY

Technical Problem

It is an object of the present specification to appropriately form a metal wiring.

Solution to Problem

In order to solve the above problem, the present specification discloses a circuit forming method including a first wiring forming step of forming a first metal wiring on a resin layer, and a second wiring forming step of forming a second metal wiring on the first metal wiring, in which a Young's modulus of the first metal wiring and a Young's modulus of the second metal wiring are different from each other.

Advantageous Effects

In the present disclosure, the second metal wiring is formed on the first metal wiring, and the Young's modulus of the first metal wiring and the Young's modulus of the second metal wiring are different from each other. As described above, two wirings having different Young's moduli are formed in duplicate, so that metal wirings can be appropriately formed.

DESCRIPTION OF EMBODIMENTS

Figure 1:
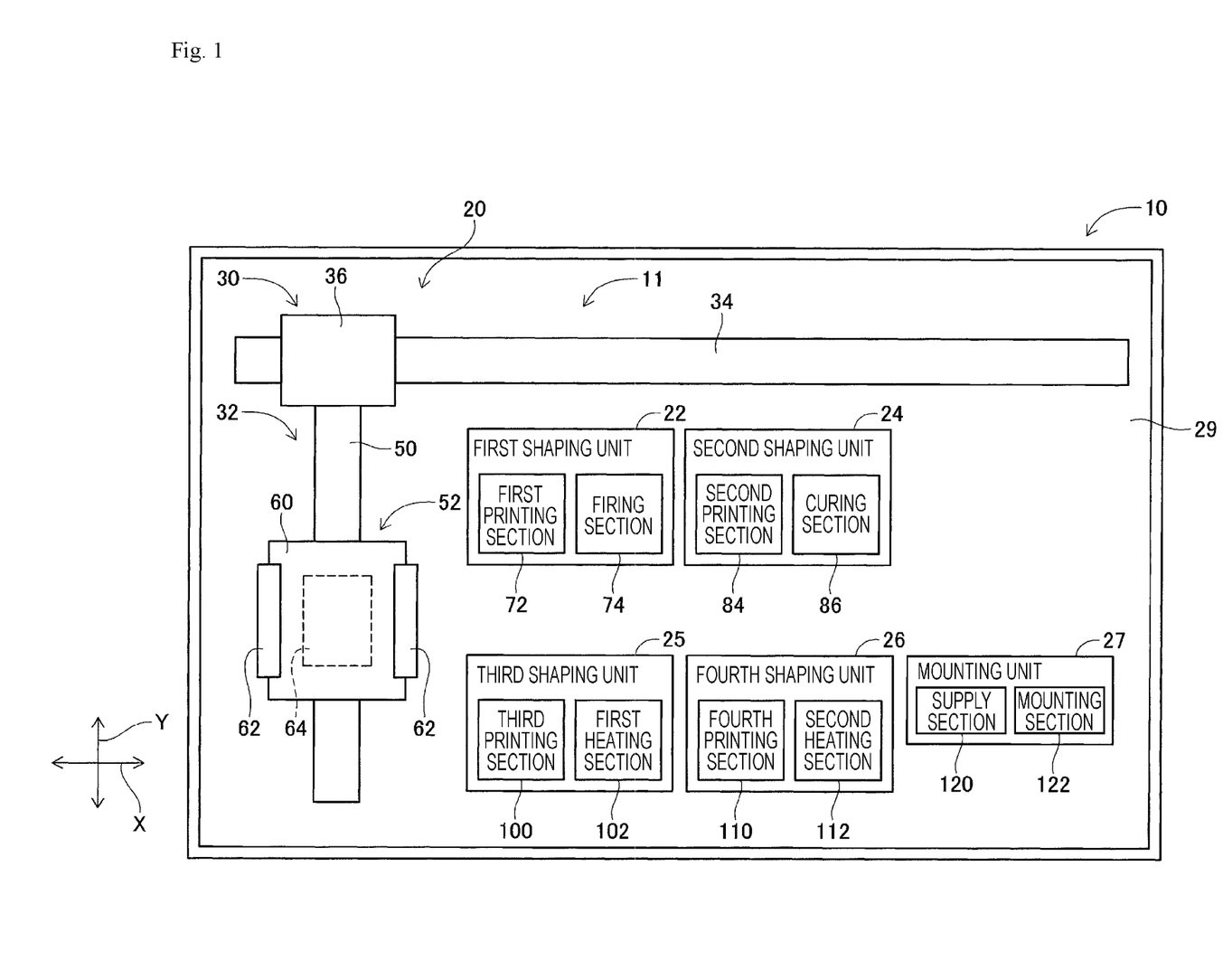
FIG. 1 is a diagram illustrating a circuit forming device.

FIG. 1 illustrates circuit forming device 10. Circuit forming device 10 includes conveyance device 20, first shaping unit 22, second shaping unit 24, third shaping unit 25, fourth shaping unit 26, mounting unit 27, and control device 28 (refer to FIG. 2). Conveyance device 20, first shaping unit 22, second shaping unit 24, third shaping unit 25, fourth shaping unit 26, and mounting unit 27 are disposed on base 29 of circuit forming device 10. Base 29 has a generally rectangular shape, and in the following description, a longitudinal direction of base 29 will be referred to as an X-axis direction, a short direction of base 29 will be referred to as a Y-axis direction, and a direction orthogonal to both the X-axis direction and the Y-axis direction will be referred to as a Z-axis direction.

Conveyance device 20 includes X-axis slide mechanism 30 and Y-axis slide mechanism 32. X-axis slide mechanism 30 includes X-axis slide rail 34 and X-axis slider 36. X-axis slide rail 34 is disposed on base 29 to extend in the X-axis direction. X-axis slider 36 is held by X-axis slide rail 34 to be slidable in the X-axis direction. X-axis slide mechanism 30 further includes electromagnetic motor 38 (refer to FIG. 2), and X-axis slider 36 is moved to any position in the X-axis direction by driving electromagnetic motor 38. In addition, Y-axis slide mechanism 32 includes Y-axis slide rail 50 and stage 52. Y-axis slide rail 50 is disposed on base 29 to extend in the Y-axis direction and is movable in the X-axis direction. One end portion of Y-axis slide rail 50 is coupled to X-axis slider 36. Stage 52 is held on Y-axis slide rail 50 to be slidable in the Y-axis direction. Furthermore, Y-axis slide mechanism 32 includes electromagnetic motor 56 (refer to FIG. 2), and stage 52 is moved to any position in the Y-axis direction by driving electromagnetic motor 56. In this manner, stage 52 is moved to any position on base 29 with driving of X-axis slide mechanism 30 and Y-axis slide mechanism 32.

Stage 52 includes base plate 60, holding devices 62, and lifting and lowering device 64. Base plate 60 is formed in a flat plate shape, and a board is placed on an upper surface of base plate 60. Holding devices 62 are provided on both side parts of base plate 60 in the X-axis direction. The board placed on base plate 60 is fixedly held by sandwiching both edge portions of the board in the X-axis direction with holding devices 62. In addition, lifting and lowering device 64 is disposed below base plate 60, and lifts and lowers base plate 60.

First shaping unit 22 is a unit that shapes a wiring on the board placed on base plate 60 of stage 52, and includes first printing section 72 and firing section 74. First printing section 72 includes inkjet head 76 (refer to FIG. 2), and inkjet head 76 linearly discharges metal ink. The metal ink is ink obtained by dispersing nanometer-sized metal fine particles, for example, silver fine particles in a solvent. A surface of the metal fine particle is coated with a dispersant and aggregation in the solvent is prevented. Further, inkjet head 76 discharges the metal ink from multiple nozzles by, for example, a piezo method using a piezoelectric element.

Figure 2:
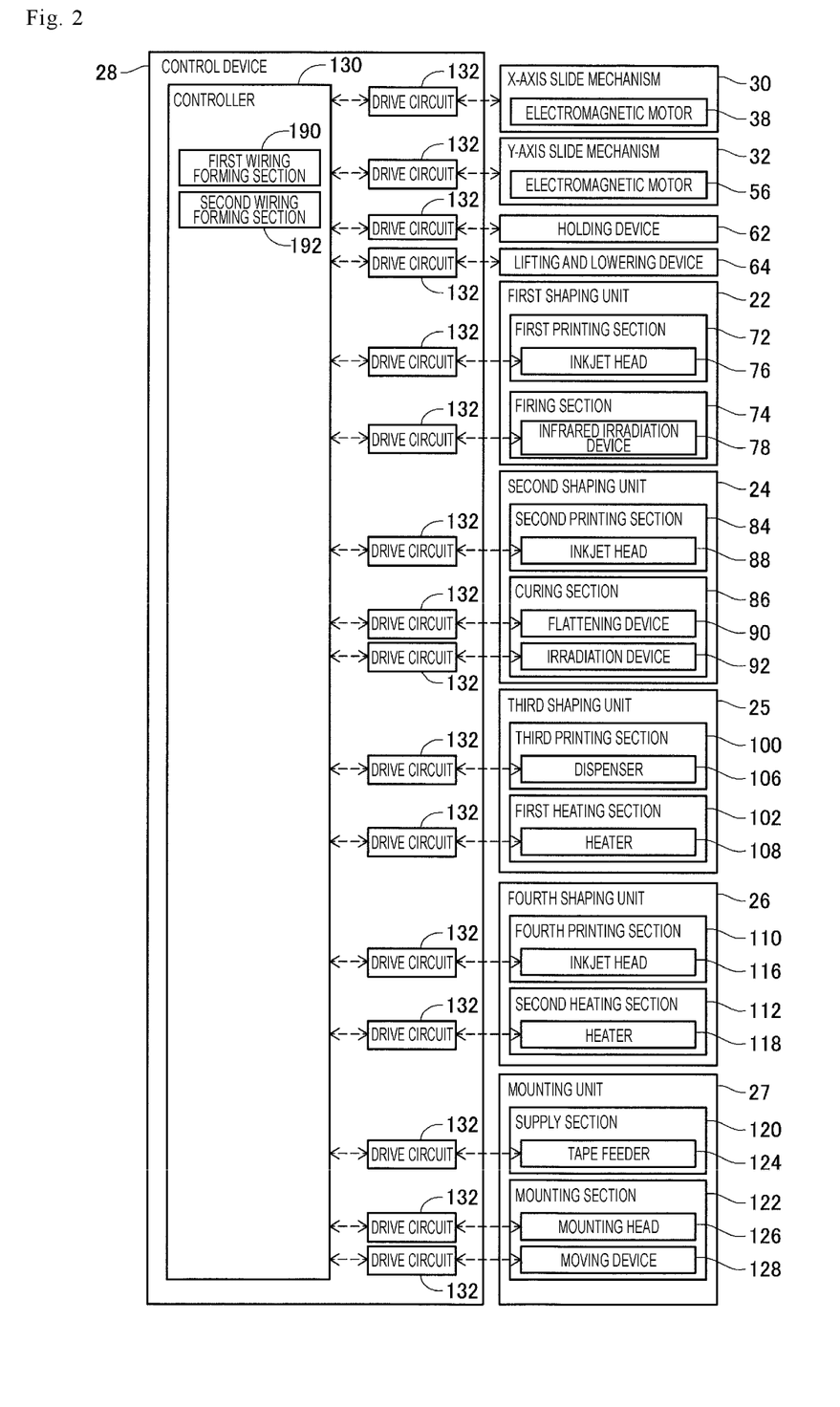
FIG. 2 is a block diagram illustrating a control device.

Firing section 74 includes infrared irradiation device 78 (refer to FIG. 2). Infrared irradiation device 78 is a device that irradiates the discharged metal ink with infrared rays, and the metal ink irradiated with infrared rays is fired to form the wiring. Firing of the metal ink is a phenomenon in which energy is applied so as to vaporize the solvent and decompose a protective film of the metal fine particle, that is, the dispersant, and the metal fine particles are contacted or fused with each other, and thus conductivity is increased. Then, the metal ink is fired to form a metal wiring.

Second shaping unit 24 is a unit that shapes a resin layer on the board placed on base plate 60 of stage 52, and includes second printing section 84 and curing section 86. Second printing section 84 includes inkjet head 88 (refer to FIG. 2), and inkjet head 88 discharges an ultraviolet curable resin. The ultraviolet curable resin is a resin that is cured by irradiation with ultraviolet rays. Inkjet head 88 may be, for example, a piezo type inkjet head using a piezoelectric element, or may be a thermal type inkjet head in which a resin is heated to generate air bubbles, which are discharged from multiple nozzles.

Curing section 86 includes flattening device 90 (refer to FIG. 2) and irradiation device 92 (refer to FIG. 2). Flattening device 90 flattens an upper surface of the ultraviolet curable resin discharged by inkjet head 88, and for example, scrapes up excess resin by a roller or a blade while smoothening the surface of the ultraviolet curable resin, to make the thickness of the ultraviolet curable resin uniform. In addition, irradiation device 92 includes a mercury lamp or LED as a light source, and irradiates the discharged ultraviolet curable resin with ultraviolet rays. As a result, the discharged ultraviolet curable resin is cured to form a resin layer.

Third shaping unit 25 is a unit that shapes a connection portion between an electrode of an electronic component and the wiring on the board placed on base plate 60 of stage 52, and includes third printing section 100 and first heating section 102. Third printing section 100 includes dispenser 106 (refer to FIG. 2), and dispenser 106 discharges conductive resin paste. The conductive resin paste is paste in which micrometer-sized metal particles are dispersed in a resin cured by heating at a relatively low temperature. Incidentally, the metal particles are flake-shaped, and viscosity of the conductive resin paste is relatively higher than that of the metal ink. The discharge amount of the conductive resin paste by dispenser 106 is controlled by an inner diameter of a needle, the pressure during discharge, and the discharge time.

First heating section 102 includes heater 108 (refer to FIG. 2). Heater 108 is a device that heats the conductive resin paste applied by dispenser 106, and a resin is cured in the heated conductive resin paste. In this case, in the conductive resin paste, the resin is cured and contracted, and the dispersed flake-shaped metal particles contact the resin. As a result, the conductive resin paste exhibits conductivity. In addition, the resin of the conductive resin paste is an organic adhesive, and exhibits an adhesive force when cured by heating.

Fourth shaping unit 26 is a unit that shapes a resin for fixing a periphery of an electronic component to be described later, and includes fourth printing section 110 and second heating section 112. Fourth printing section 110 includes inkjet head 116 (refer to FIG. 2), and inkjet head 116 discharges a thermosetting resin. The thermosetting resin is a resin that is cured by heating. Inkjet head 116 is, for example, a piezo type using a piezoelectric element. Second heating section 112 includes heater 118 (refer to FIG. 2). Heater 118 is a device that heats the discharged thermosetting resin, and the heated thermosetting resin is cured.

Mounting unit 27 is a unit that mounts an electronic component on the board placed on base plate 60 of stage 52, and includes supply section 120 and mounting section 122. Supply section 120 includes multiple tape feeders 124 (refer to FIG. 2) that feed the taped electronic components one by one, and supplies the electronic component to the supply position. Supply section 120 is not limited to tape feeder 124, and may be a tray-type supply device that supplies the electronic component by picking up the electronic component from a tray. Further, supply section 120 may include both of the tape-type supply device and the tray-type supply device, or other supply devices.

Mounting section 122 includes mounting head 126 (refer to FIG. 2) and moving device 128 (refer to FIG. 2). Mounting head 126 includes a suction nozzle (not illustrated) for picking up and holding the electronic component. The suction nozzle picks up and holds the electronic component by suction of air when negative pressure is supplied from a positive and negative pressure supply device (not illustrated). As a slight positive pressure is supplied from the positive and negative pressure supply device, the electronic component is separated. In addition, moving device 128 moves mounting head 126 between the supply position of the electronic component by tape feeder 124 and the board placed on base plate 60. As a result, in mounting section 122, the electronic component supplied from tape feeder 124 is held by the suction nozzle, and the electronic component held by the suction nozzle is mounted on the board.

As illustrated in FIG. 2, control device 28 includes controller 130 and multiple drive circuits 132. Multiple drive circuits 132 are connected to electromagnetic motors 38 and 56, holding device 62, lifting and lowering device 64, inkjet head 76, infrared irradiation device 78, inkjet head 88, flattening device 90, irradiation device 92, dispenser 106, heater 108, inkjet head 116, heater 118, tape feeder 124, mounting head 126, and moving device 128. Controller 130 includes CPU, ROM, RAM and the like, is mainly configured as a computer, and is connected to multiple drive circuits 132. As a result, the operations of conveyance device 20, first shaping unit 22, second shaping unit 24, third shaping unit 25, fourth shaping unit 26, and mounting unit 27 are controlled by controller 130.

With the configuration described above, in circuit forming device 10, a resin stack is formed on board 70 (refer to FIG. 3), and a wiring is formed on the upper surface of the resin stack. Then, the electrodes of the electronic component are electrically connected to the wiring via the conductive resin paste, and the electronic component is fixed by the resin.

Figure 3:
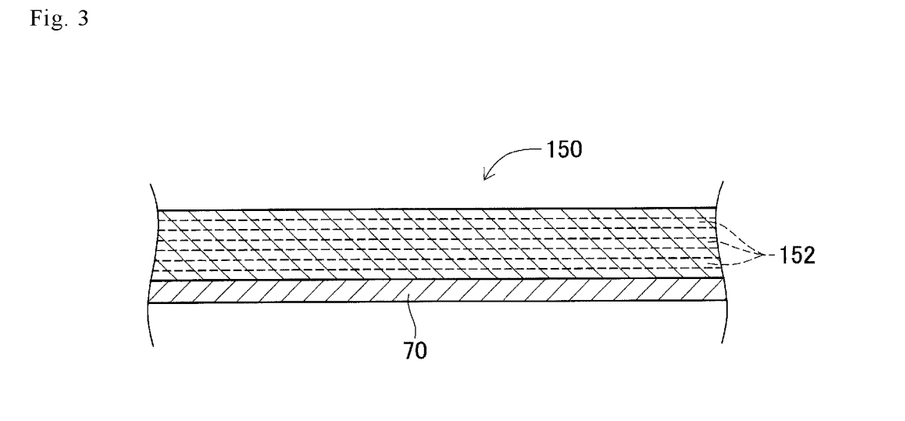
FIG. 3 is a cross-sectional view illustrating a circuit in a state where a resin stack is formed.

Specifically, board 70 is set on base plate 60 of stage 52, and stage 52 is moved below second shaping unit 24. In second shaping unit 24, as illustrated in FIG. 3, resin stack 150 is formed on board 70. Resin stack 150 is formed by repeating the discharge of the ultraviolet curable resin from inkjet head 88 and the irradiation of the discharged ultraviolet curable resin with the ultraviolet rays by irradiation device 92.

More specifically, in second printing section 84 of second shaping unit 24, inkjet head 88 discharges the ultraviolet curable resin in a thin film shape on the upper surface of board 70. Subsequently, when the ultraviolet curable resin is discharged in the thin film shape, the ultraviolet curable resin is flattened by flattening device 90 in curing section 86, so that the ultraviolet curable resin has a uniform film thickness. Irradiation device 92 irradiates the thin film-shaped ultraviolet curable resin with ultraviolet rays. As a result, thin film-shaped resin layer 152 is formed on board 70.

Subsequently, inkjet head 88 discharges the ultraviolet curable resin in a thin film shape onto thin film-shaped resin layer 152. The thin film-shaped ultraviolet curable resin is flattened by flattening device 90, and irradiation device 92 irradiates the ultraviolet curable resin discharged in the thin film shape with ultraviolet rays, and thus thin film-shaped resin layer 152 is stacked on thin film-shaped resin layer 152. As described above, the discharge of the ultraviolet curable resin on thin film-shaped resin layer 152 and the irradiation with the ultraviolet rays are repeated, and multiple resin layers 152 are stacked, and thus resin stack 150 is formed.

Figure 4:
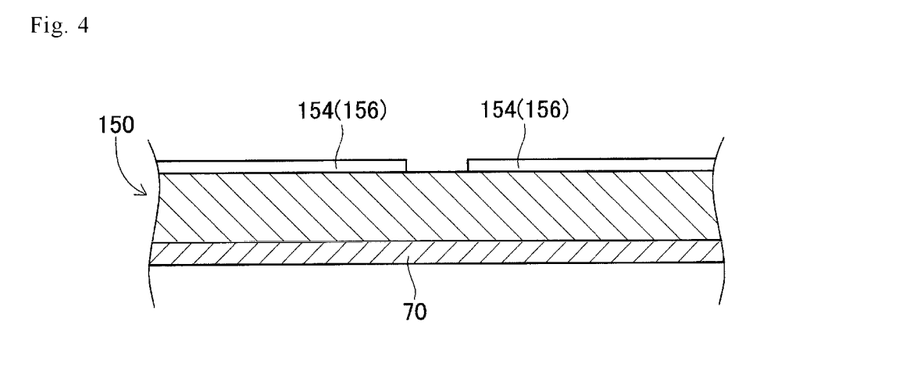
FIG. 4 is a cross-sectional view illustrating a circuit in a state where a wiring is formed on the resin stack.

When resin stack 150 is formed by the above-described procedure, stage 52 is moved below first shaping unit 22. In first printing section 72 of first shaping unit 22, as illustrated in FIG. 4, inkjet head 76 linearly discharges metal ink 154 on the upper surface of resin stack 150 in accordance with a circuit pattern. Subsequently, in firing section 74 of first shaping unit 22, infrared irradiation device 78 irradiates metal ink 154 discharged in accordance with the circuit pattern with infrared rays. As a result, metal ink 154 is fired, and wiring 156 is formed on resin stack 150.

Figure 5:
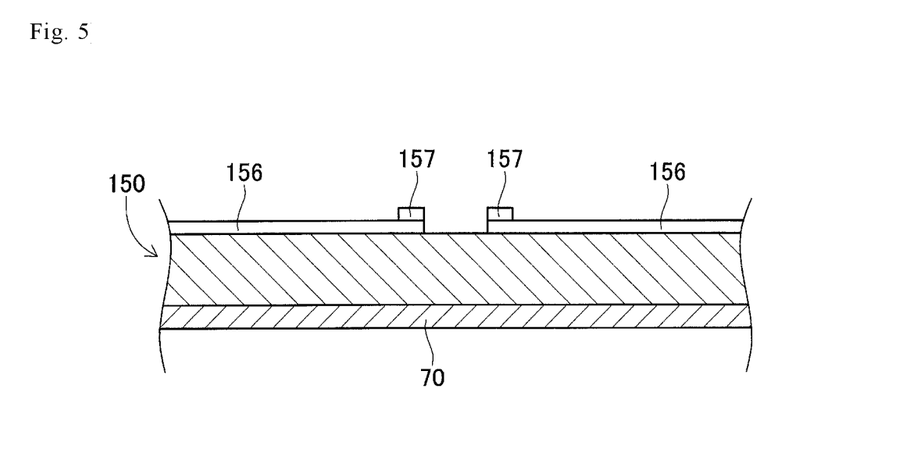
FIG. 5 is a cross-sectional view illustrating a circuit in a state where conductive resin paste is applied on the wiring.
Figure 6:
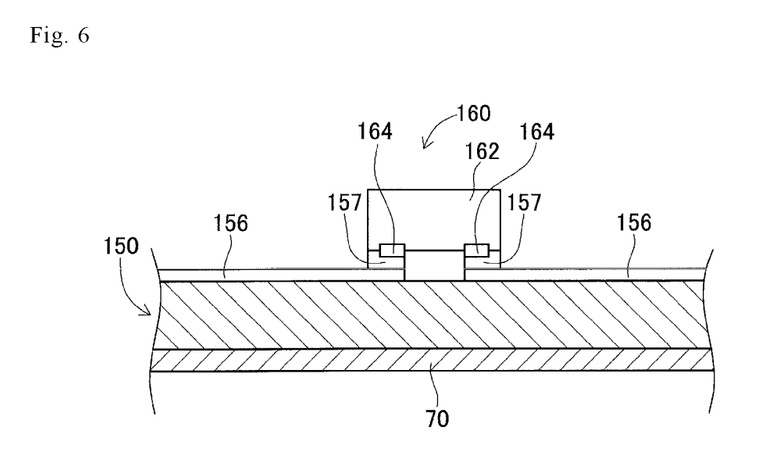
FIG. 6 is a cross-sectional view illustrating a circuit in a state where an electronic component is mounted.

Subsequently, when wiring 156 is formed on resin stack 150, stage 52 is moved below third shaping unit 25. In third printing section 100 of third shaping unit 25, dispenser 106 discharges conductive resin paste 157 onto the end portion of wiring 156, as illustrated in FIG. 5. As described above, when conductive resin paste 157 is discharged onto the end portion of wiring 156, stage 52 is moved below mounting unit 27. In mounting unit 27, electronic component 160 (refer to FIG. 6) is supplied by tape feeder 124, and electronic component 160 is held by the suction nozzle of mounting head 126. Electronic component 160 includes component main body 162 and two electrodes 164 disposed on the lower surface of component main body 162. Mounting head 126 is moved by moving device 128, and electronic component 160 held by the suction nozzle is mounted on the upper surface of resin stack 150 as illustrated in FIG. 6. In this case, electronic component 160 is mounted on the upper surface of resin stack 150 such that electrode 164 of electronic component 160 contacts conductive resin paste 157 discharged onto wiring 156. Since the lower surface of electrode 164 protrudes below from the lower surface of component main body 162, electrode 164 suitably contacts conductive resin paste 157.

As described above, when electronic component 160 is mounted on resin stack 150, stage 52 is moved below third shaping unit 25. In first heating section 102 of third shaping unit 25, conductive resin paste 157 is heated by heater 108. As a result, conductive resin paste 157 exhibits conductivity, so that electrode 164 is electrically connected to wiring 156 via conductive resin paste 157. In addition, electronic component 160 is fixed to resin stack 150 by being fixed to wiring 156 due to the adhesive force of conductive resin paste 157.

Figure 7:
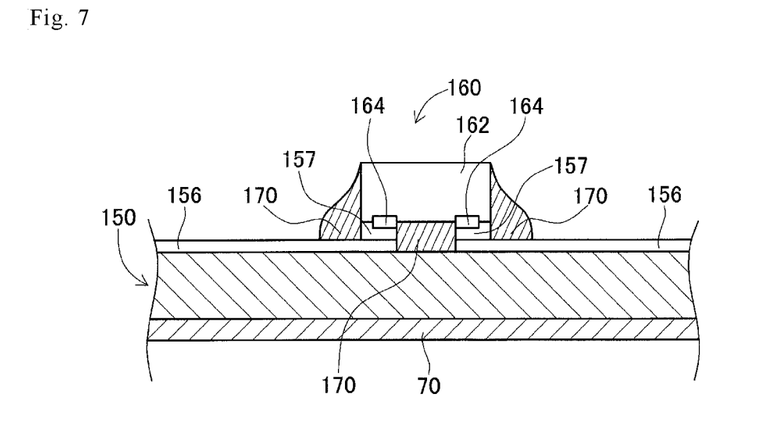
FIG. 7 is a cross-sectional view illustrating a circuit in a state where the electronic component is fixed by a resin.

As described above, when electronic component 160 is connected to the wiring, stage 52 is moved below fourth shaping unit 26. In fourth printing section 110 of fourth shaping unit 26, inkjet head 116 discharges thermosetting resin 170 between the lower surface of component main body 162 of electronic component 160 and the upper surface of resin stack 150, as illustrated in FIG. 7. As a result, thermosetting resin 170 is sealed between the upper surface of resin stack 150 and the lower surface of component main body 162. That is, thermosetting resin 170 is sealed between the upper surface of resin stack 150 and the lower surface of component main body 162. Further, inkjet head 116 discharges thermosetting resin 170 onto the periphery of electronic component 160 to cover the side surface of component main body 162 of electronic component 160. In second heating section 112, thermosetting resin 170 is heated by heater 118, so that thermosetting resin 170 is sealed between the upper surface of resin stack 150 and the lower surface of component main body 162, and is cured in a state of covering the side surface of component main body 162. As a result, electronic component 160 mounted on the upper surface of resin stack 150 is fixed by the cured resin.

Figure 8:
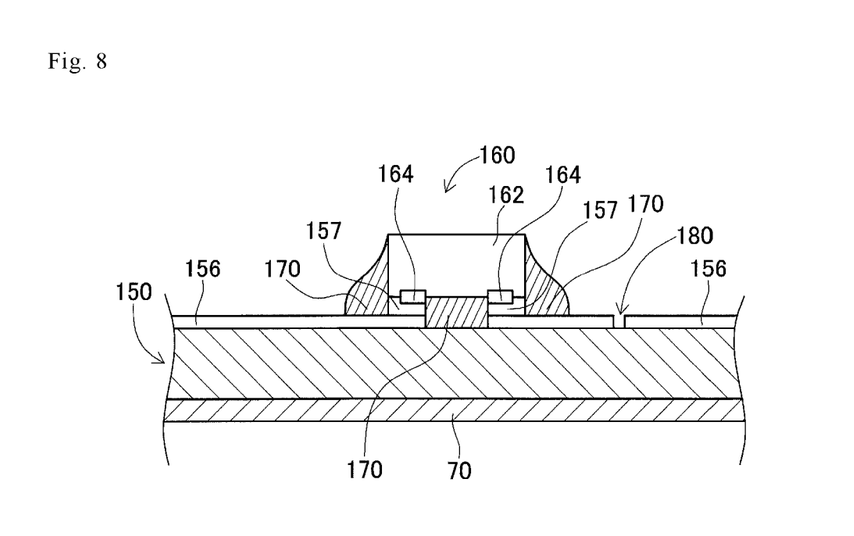
FIG. 8 is a cross-cross-sectional view illustrating a circuit in a state where the wiring is disconnected.

As described above, in circuit forming device 10, resin stack 150 is formed on board 70, and wiring 156 is formed on the upper surface of the resin stack. Electrode 164 of electronic component 160 is electrically connected to the wiring via conductive resin paste 157, and the electronic component is fixed by the thermosetting resin, and thus a circuit is formed. However, there is a concern since the circuit is formed of multiple materials such as an ultraviolet curable resin, metal ink, conductive resin paste, and a thermosetting resin, stress occurs in wiring 156 when the temperature changes due to the difference in the coefficient of linear expansion of those multiple materials, and thus wiring 156 is disconnected. That is, there is a concern since the expansion amount and the contraction amount of each material when the temperature changes are different, stress occurs in wiring 156 when the temperature changes, and thus wiring 156 is disconnected. In particular, since electronic component 160 hardly expands or contracts when the temperature changes, stress occurs in wiring 156 starting from the mounting position of electronic component 160. Therefore, as illustrated in FIG. 8, there is a high possibility that crack 180 occurs in wiring 156 at a portion close to the connection position of electronic component 160 to electrode 164, and thus the disconnection occurs.

Figure 9:
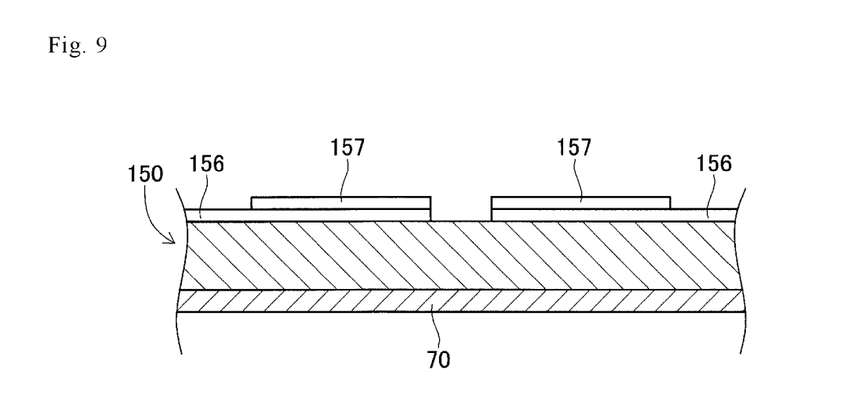
FIG. 9 is a cross-sectional view illustrating a circuit in a state where the conductive resin paste is linearly applied on the wiring.
Figure 10:
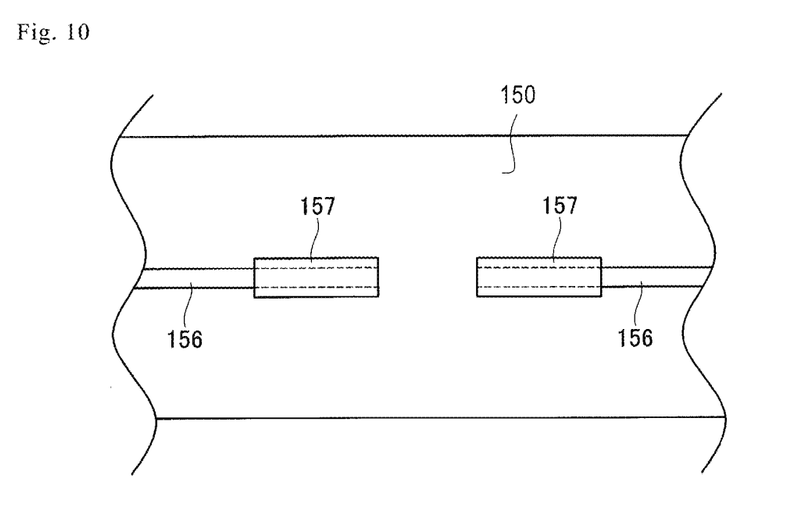
FIG. 10 is a plan view illustrating a circuit in a state where the conductive resin paste is linearly applied on the wiring.

In view of this, in circuit forming device 10, a second wiring different from the wiring is formed on wiring 156, so that the power supply to electronic component 160 is ensured. Specifically, as in the conventional method, resin stack 150 is formed of the ultraviolet curable resin, and wiring 156 is formed on the upper surface of resin stack 150 by the metal ink. In third printing section 100 of third shaping unit 25, when conductive resin paste 157 is discharged onto wiring 156 by dispenser 106, as illustrated in FIG. 9, conductive resin paste 157 is linearly discharged not only on the end portion of wiring 156, that is, not only a planned mounting position of electrode 164 of electronic component 160, but also from that end portion onto wiring 156 of a predetermined length. That is, conductive resin paste 157 having a predetermined length is linearly discharged from the end portion of wiring 156 along the upper surface of wiring 156. In this case, as illustrated in FIG. 10, conductive resin paste 157 is discharged onto the upper surface of wiring 156 to be wider than wiring 156.

Figure 11:
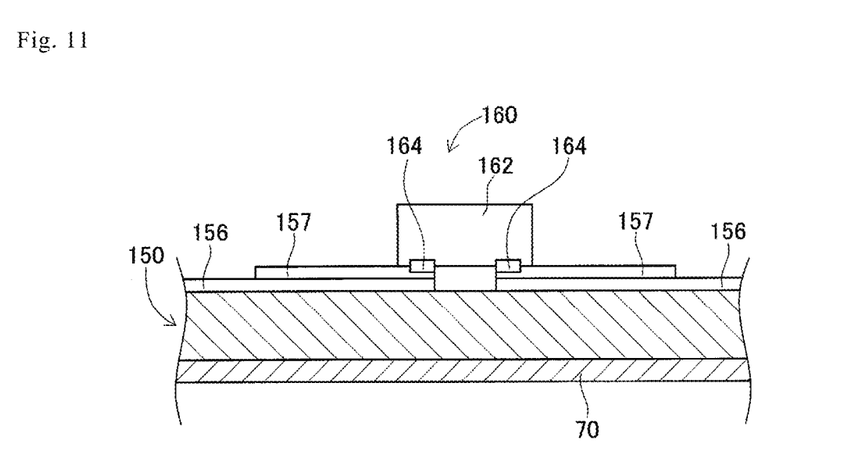
FIG. 11 is a cross-sectional view illustrating a circuit in a state where the electronic component is mounted.

As described above, when conductive resin paste 157 is discharged onto the upper surface of wiring 156, electronic component 160 is mounted on the upper surface of resin stack 150 such that electrode 164 of electronic component 160 contacts the end portion of conductive resin paste 157 which is linearly discharged onto the wiring in mounting unit 27, as illustrated in FIG. 11. In first heating section 102 of third shaping unit 25, conductive resin paste 157 is heated by heater 108. As a result, conductive resin paste 157 exhibits conductivity, so that electrode 164 is electrically connected to wiring 156 via conductive resin paste 157, and the second wiring by conductive resin paste 157 having a wider width than the wiring is formed on wiring 156.

Figure 12:
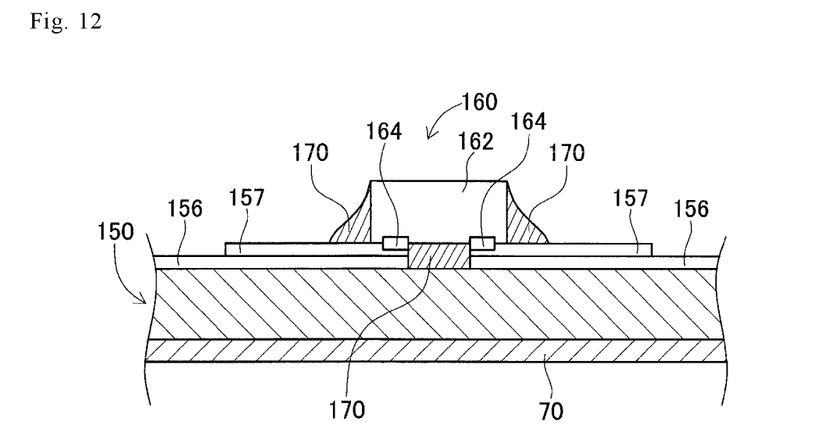
FIG. 12 is a cross-sectional view illustrating a circuit in a state where the electronic component is fixed by the resin.

As described above, when the second wiring by conductive resin paste 157 is formed on wiring 156, in fourth printing section 110 of fourth shaping unit 26, thermosetting resin 170 is discharged between the lower surface of component main body 162 of electronic component 160 and the upper surface of resin stack 150, and the periphery of electronic component 160, as illustrated in FIG. 12. In second heating section 112, thermosetting resin 170 is heated by heater 118, so that thermosetting resin 170 is sealed between the upper surface of resin stack 150 and the lower surface of component main body 162, and is cured in a state of covering the side surface of component main body 162. As a result, a circuit in which electronic component 160 mounted on the upper surface of resin stack 150 is fixed by the cured resin is formed.

As described above, in the circuit in which the second wiring is formed of conductive resin paste 157 on wiring 156, that is, on the first wiring by metal ink 154, the power supply to electronic component 160 can be ensured by the second wiring even when the first wiring is disconnected. Specifically, since the first wiring is formed of metal ink 154 and the second wiring is formed of conductive resin paste 157, the Young's modulus of the first wiring and the Young's modulus of the second wiring are different from each other. The Young's modulus is a proportionality factor between strain and stress in the elastic range, and is a ratio of the stress to the strain. Therefore, in a case where an object having a high Young's modulus and an object having a low Young's modulus are deformed at the same stress, the object having a low Young's modulus deforms more than the object having a high Young's modulus. That is, an object having a low Young's modulus is easy to deform, and an object having a high Young's modulus is hard to deform. The Young's modulus of the first wiring by metal ink 154 is approximately 80 GPa. On the other hand, the Young's modulus of the second wiring by conductive resin paste 157 is approximately 1 to 100 MPa. That is, the Young's modulus of the second wiring by conductive resin paste 157 is lower than the Young's modulus of the first wiring by metal ink 154, and the second wiring by conductive resin paste 157 is easier to deform than the first wiring by metal ink 154. On the other hand, the Young's modulus of the first wiring by metal ink 154 is higher than the Young's modulus of the second wiring by conductive resin paste 157, and the first wiring by metal ink 154 is harder to deform than the second wiring by conductive resin paste 157.

Figure 13:
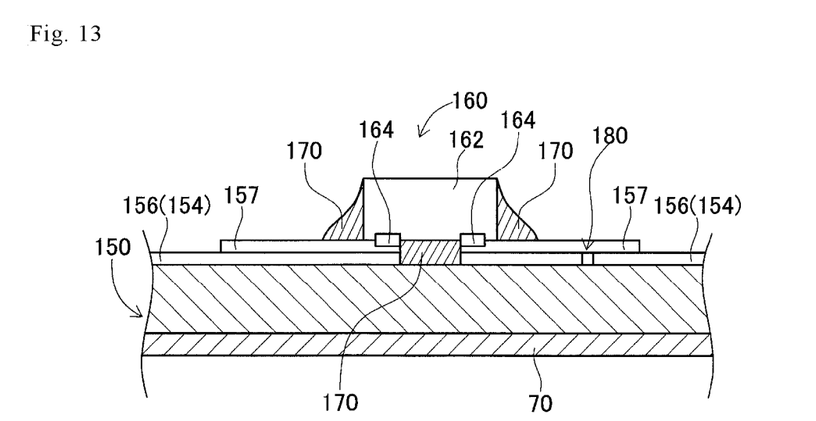
FIG. 13 is a cross-sectional view illustrating a circuit in a state where a first wiring is disconnected and a second wiring functions as a bypass.

Therefore, there is a concern, in a case where the first wiring by metal ink 154 expands and stretches when the temperature changes, since the first wiring by metal ink 154 is hard to deform, as illustrated in FIG. 13, crack 180 occurs in the first wiring by metal ink 154, and thus the wire is disconnected. On the other hand, even in a case where the second wiring by conductive resin paste 157 expands and stretches when the temperature changes, the second wiring by conductive resin paste 157 is easy to deform, so that it is difficult to disconnect the wire by stretching. As described above, even when the first wiring by metal ink 154 is disconnected when the temperature changes, since the second wiring formed on the first wiring is not disconnected, the second wiring functions as a bypass, so that the power supply to electronic component 160 can be ensured. That is, the second wiring having a Young's modulus lower than that of the first wiring on the first wiring is formed, so that the power supply to electronic component 160 can be ensured by the second wiring.

The width of the second wiring by conductive resin paste 157 is wider than the width of the first wiring by metal ink 154. Therefore, the second wiring by conductive resin paste 157 covers the first wiring by metal ink 154 in a width direction, so that the power supply to electronic component 160 can be more suitably ensured.

The second wiring by conductive resin paste 157 is formed only on the periphery of the connection portion to electrode 164 instead of the entire first wiring by metal ink 154. That is, the second wiring by conductive resin paste 157 is formed only in a portion where the first wiring by metal ink 154 is highly likely to be disconnected. As a result, it is possible to shorten the formation time of the second wiring, reduce the cost, and the like as compared with the case where the second wiring is formed on the entire first wiring.

As illustrated in FIG. 2, controller 130 of control device 28 includes first wiring forming section 190 and second wiring forming section 192. First wiring forming section 190 is a functional section for forming a first wiring by metal ink 154. Second wiring forming section 192 is a functional section for forming a second wiring by conductive resin paste 157 on the first wiring by metal ink 154.

In the above embodiment, resin stack 150 is an example of a resin layer. The first wiring by metal ink 154 is an example of a first metal wiring. The second wiring by conductive resin paste 157 is an example of a second metal wiring. Electronic component 160 is an example of a component. A step performed by first wiring forming section 190 is an example of a first wiring forming step. A step performed by second wiring forming section 192 is an example of a second wiring forming step.

The present disclosure is not limited to the above embodiment, and can be performed in various aspects to which various modifications and improvements are applied based on the knowledge of those skilled in the art. For example, in the above embodiment, the second wiring by conductive resin paste 157 is formed on the first wiring by metal ink 154, but the first wiring by metal ink 154 may be formed on the second wiring by conductive resin paste 157. That is, a wiring having a high Young's modulus may be formed on a wiring having a low Young's modulus.

In the above embodiment, the second wiring by conductive resin paste 157 is formed only on a part of the first wiring by metal ink 154, but the second wiring by conductive resin paste 157 may be formed on the entire first wiring by metal ink 154.

In the above embodiment, the second wiring is formed of conductive resin paste 157 having a wider width than the first wiring by metal ink 154, but the second wiring may be formed of conductive resin paste 157 having a narrower width than the first wiring by metal ink 154 or the same width as the first wiring.

In the above embodiment, the second wiring is formed on the periphery of the connection portion of the first wiring to the electrode of electronic component 160, but the second wiring may be formed on the periphery of the connection portion to other components, such as vias, connecting pins, and the like.

In the above-described embodiment, the first wiring is formed of metal ink 154 and the second wiring is formed of conductive resin paste 157, but various materials can be adopted as long as the materials can form the metal wiring.

In the above embodiment, resin stack 150 is formed of an ultraviolet curable resin, but may be formed of a thermosetting resin, a two-liquid mixed curable resin, a thermoplastic resin, or the like.

In the above embodiment, conductive resin paste 157 is discharged by dispenser 106, but may be transferred by a transfer device or the like. Further, conductive resin paste 157 may be printed by screen printing.

REFERENCE SIGNS LIST

150: Resin stack (resin layer), 154: metal ink (first wiring), 157: conductive resin paste (second wiring), 160: electronic component (component), 190: first wiring forming section (first wiring forming step), 192: second wiring forming section (second wiring forming step)

The invention claimed is:

1. A circuit forming method comprising:
   a first wiring forming step of forming a pair of first metal wirings on a resin layer that are separated by a gap;
   a base thermosetting resin forming step of discharging a thermosetting resin into the gap; and
   a second wiring forming step of forming a pair of second metal wirings to respectively cover the first metal wirings in a width direction of the first metal wirings, the second metal wirings being separated by the gap, wherein
   a width of the second wirings is wider than a width of the first wirings in the width direction,
   ends of the second wirings in the width direction contact the resin layer, and
   a Young's modulus of the first metal wirings and a Young's modulus of the second metal wirings are different from each other.

2. The circuit forming method according to claim 1, wherein in the second wiring forming step, each of the second metal wirings are respectively formed on a periphery of a connection portion of a component electrically connected to the first metal wirings.

3. The circuit forming method according to claim 2, further comprising:
   a side thermosetting resin forming step of discharging a thermosetting resin onto a periphery of the component to cover a side surface of the component, a side surface of the second metal wirings, and a top surface of the first metal wirings.

4. The circuit forming method according to claim 2, further comprising:
   a side thermosetting resin forming step of discharging a thermosetting resin onto a periphery of the component to cover a side surface of the component and a top surface of the second metal wirings.

5. The circuit forming method according to claim 1, wherein one of the first metal wirings and the second metal wirings is formed of a metal-containing liquid containing a metal fine particle having a nanometer size, and
   the other of the first metal wirings and the second metal wirings is formed of a metal-containing liquid containing a metal fine particle having a micrometer size.

6. The circuit forming method according to claim 1, wherein the Young's modulus of the second metal wirings is lower than the Young's modulus of the first metal wirings.

* * * * *